US007667556B2

(12) United States Patent
Ezzeddine

(10) Patent No.: US 7,667,556 B2
(45) Date of Patent: Feb. 23, 2010

(54) INTEGRATED POWER COMBINER/SPLITTER

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 394 days.

(21) Appl. No.: 11/605,880

(22) Filed: Nov. 29, 2006

(65) Prior Publication Data

US 2007/0120622 A1 May 31, 2007

(30) Foreign Application Priority Data

Nov. 30, 2005 (FR) .................................. 05 53652

(51) Int. Cl.
*H03H 7/38* (2006.01)

(52) U.S. Cl. ....................... 333/131; 333/112; 333/118; 333/24 C; 333/24 R

(58) Field of Classification Search ................. 333/112, 333/118, 24 R, 24 C, 131
See application file for complete search history.

(56) References Cited

U.S. PATENT DOCUMENTS

| | | | |
|---|---|---|---|
| 3,999,150 | A | 12/1976 | Caragliano et al. |
| 5,818,308 | A | 10/1998 | Tanaka et al. |
| 6,396,362 | B1 | 5/2002 | Mourant et al. |
| 6,765,455 | B1 | 7/2004 | De Lillo et al. |
| 2003/0080827 | A1 | 5/2003 | Chominski |
| 2003/0151881 | A1 | 8/2003 | Yue |
| 2004/0182602 | A1 | 9/2004 | Satoh et al. |
| 2005/0052257 | A1 | 3/2005 | Ezzeddine |
| 2005/0264273 | A1 | 12/2005 | Ezzedine |
| 2006/0087384 | A1 | 4/2006 | Ezzedine |
| 2007/0120637 | A1 | 5/2007 | Ezzeddine |
| 2007/0296519 | A1 | 12/2007 | Ezzeddine |

FOREIGN PATENT DOCUMENTS

| | | |
|---|---|---|
| JP | 2003018039 A | 1/2003 |

OTHER PUBLICATIONS

French Search Report from corresponding French Application No. 05/53648, filed Nov. 30, 2005.

French Search Report from corresponding French Application No. 05/53652 dated Aug. 2, 2006.

French Search Report dated Feb. 16, 2007 from corresponding French Application No. 06/52586.

Noureddine Boulejfen et al. "*Frequency- and Time-Domain Analyses of Nonuniform Lossy Coupled Transmission Lines with Linear and Nonlinear Terminations*" IEEE Transactions on Microwave Theory and Techniques, IEEE Service Center, Piscataway, NJ, US, vol. 48, No. 3,. Mar. 2000, XP11037904 p. 367-379.

Ohba Y et al: '"*Directional Coupler With Coupled Nonuniform Transmission Line Represented By Lumped Brune Section And Uniform Transmission Line*", Electronics & Communications in Japan, Part III—Fundamental Electronic Science, Wiley, Hoboken, NJ, US, vol. 80, No. 4 Apr. 1997, pp. 71-81, XPOO0723465.

*Primary Examiner*—Robert Pascal
*Assistant Examiner*—Kimberly E Glenn
(74) *Attorney, Agent, or Firm*—Lisa K. Jorgenson; William R. McClellan; Wolf, Greenfield & Sacks, P.C.

(57) ABSTRACT

A combiner/splitter with distributed lines including a first line formed of a first planar winding in a first conductive level and of a second planar winding in a second conductive level; a second line formed of a third planar winding interdigited with the first winding in the first level, and of a fourth planar winding interdigited with the second winding in the second level; a first capacitive element connecting the external ends of the first and third windings; and a second capacitive element connecting the external ends of the second and fourth windings.

10 Claims, 2 Drawing Sheets

INTEGRATED POWER COMBINER/SPLITTER

BACKGROUND OF THE INVENTION

1. Field of the Invention

The present invention generally relates to power combiners/splitters in a distributed or coupled line technology. Such devices are used to divide an input power between two balanced paths or to add two input powers in a common path. Such devices can generally be found in association with balanced power amplifiers, mixers, phase shifters, most often to combine several powers obtained from several different amplification paths.

2. Discussion of the Related Art

FIG. 1 shows, in the form of a block, a power combiner/splitter (COMB/DIV) 1. This circuit comprises an access IN, arbitrarily designated as an input, intended to receive a signal Pin, the power of which is to be distributed (or to provide a combined signal), and two accesses OUT1 and OUT2, arbitrarily designated as outputs, intended to provide distributed power signals Pout1 and Pout2 (or to receive signals, the powers of which are to be combined) in phase or in phase quadrature. Circuit 1 has the function not only of equitably distributing power Pin between output accesses Pout1 and Pout2 in phase or in phase quadrature, but also of ensuring the isolation between these accesses. Such a device most often is bi-directional, that is, it can be used, according to its assembly in an electronic circuit, to combine two powers Pout1 and Pout2 in a single signal Pin or to equally distribute a power Pin between two powers Pout1 and Pout2.

The present invention more specifically relates to combiners/splitters having their distributed accesses (OUT1 and OUT2) in phase quadrature.

As compared with a coupler having the function of extracting a small part of a transmitted power for measurement purposes, a power combiner/splitter should respect parameters of phase balance and amplitude balance between the distributed paths.

FIG. 2 very schematically shows in the form of blocks a conventional example of a radio-frequency transmit circuit using a combiner (combiner-assembled block 1 of FIG. 1). Combiner 1 is interposed between the outputs OUT0 and OUT90, phase-shifted by 90° with respect to each other, of two power amplifiers 11 and 12 (PA) of a radio-frequency transmit head 10. Impedance matching circuits 13 and 14 (MATCH) shown in dotted lines may be interposed between amplifiers 11 and 12 and accesses OUT1 and OUT2 of the combiner. Each amplifier 11, 12 receives a radio-frequency signal RF0, RF90 originating from a phase-shift circuit 13 which itself receives two differential radio-frequency signals RFin+ and RFin− to be transmitted. Circuit 10 is supplied by a generally D.C. voltage Valim.

Combiner 1 adds signals OUT0 and OUT90 to form a signal IN sent onto an antenna 16 for transmission. A coupler may be added to the combiner to extract data proportional to the power POUT transmitted on access IN to possibly adjust the gains of amplifiers 11 and 12.

The same type of architecture may be used for a receive chain. In this case, the combined access (IN) is used as an input terminal while the two distributed accesses (OUT1 and OUT2) are used as phase-shifted output terminals (in phase quadrature) towards two receive inputs of a radio-frequency receive head.

To economize the power consumed by the amplification circuits (in transmit or receive mode), the signals are most often distributed in two paths in phase quadrature. Thereby, combiners/splitters are generally in phase quadrature for the distributed accesses.

The forming of combiners/splitters may use techniques said to be with local elements (association of inductive and capacitive elements) or with distributed or coupled lines (conductive lines arranged sufficiently close to each other to generate an electromagnetic coupling).

The present invention more specifically applies to combiners/splitters with distributed lines.

FIG. 3 shows a conventional example of a combiner/splitter formed in a distributed line technology. A first conductive line 21 connects combined access terminal IN to one, OUT1, of the distributed access terminals. A second conductive line, 22, connects a second distributed access terminal OUT2 to a terminal ISO left floating. Lines 21 and 22 are parallel and are generally formed by using planar track technologies of the type used in printed circuits. If, as shown, terminal OUT2 is on the side of terminal IN, the distributed accesses are in phase quadrature. If terminal OUT2 had been in the place of terminal ISO, the distributed accesses would be in phase.

To obtain the combiner/splitter effect, the coupler thus formed must be at 3 dB so that the power of terminal IN is distributed by half on each of terminals OUT1 and OUT2. In the architecture of FIG. 3, the length of each of lines 21 and 22 should correspond to one quarter of the wavelength ($\lambda/4$) of the work frequency of the combiner/splitter, that is, to one quarter of the wavelength of the central frequency of its bandwidth.

A disadvantage of a conventional combiner/splitter such as illustrated in FIG. 3 is its bulk for high frequencies which makes it in practice impossible to use in integrated circuits. For example, for a frequency on the order of one gigahertz now corresponding to the frequency bands used in mobile telephony, lines 21 and 22 should exhibit lengths of 34 mm each.

Another disadvantage is that this length of the conductive lines generates high network losses.

It should be noted that a combiner/splitter is fundamentally different from a balun (balanced/unbalanced) transformer which comprises a common-mode access and two differential-mode accesses. In particular, a balun does not enable obtaining a quadrature phase-shift, which is necessary in combiners to which the present invention applies. Further, distributed-line baluns are bulky since they have wavelengths equal to one quarter of the wavelength.

SUMMARY OF THE INVENTION

The present invention aims at overcoming all or part of the disadvantages of conventional combiners/splitters in phase quadrature.

The present invention more specifically aims at forming a combiner/splitter in phase quadrature by using a thin layer technology used in integrated circuit manufacturing.

The present invention also aims at decreasing the bulk of a combiner/splitter with respect to conventional distributed line solutions.

The present invention also aims at providing a solution enhancing the coupling between lines to minimize insertion losses.

To achieve all or part of these objects, the present invention provides a combiner/splitter with distributed lines comprising:

a first line formed of a first planar winding in a first conductive level and of a second planar winding in a second conductive level;

a second line formed of a third planar winding interdigited with the first winding in the first level, and of a fourth planar winding interdigited with the second winding in the second level;

a first capacitive element connecting the external ends of the first and third windings; and a second capacitive element connecting the external ends of the second and fourth windings.

According to an embodiment of the present invention, the windings forming a same line wind in inverse directions.

According to an embodiment of the present invention, the first and third windings have a length difference of one quarter of a turn; and the second and fourth windings have a length difference of one quarter of a turn.

According to an embodiment of the present invention, the capacitive elements have values selected from a range from 0.1 to 10 picofarads.

The present invention also aims at a method for manufacturing a combiner/splitter with two coupled lines, comprising the steps of:

forming the lines in the form of planar conductive windings in two levels stacked on each other, each line comprising a winding in each level and the two windings of a same plane being interdigited with each other; and connecting a first capacitive element to connect first ends of the lines;

connecting a second capacitive element to connect second ends of the lines.

According to an embodiment of the present invention, the central ends of the windings of a same line are connected by a conductive via.

The foregoing and other objects, features, and advantages of the present invention will be discussed in detail in the following non-limiting description of specific embodiments in connection with the accompanying drawings.

DETAILED DESCRIPTION

Figure 1:
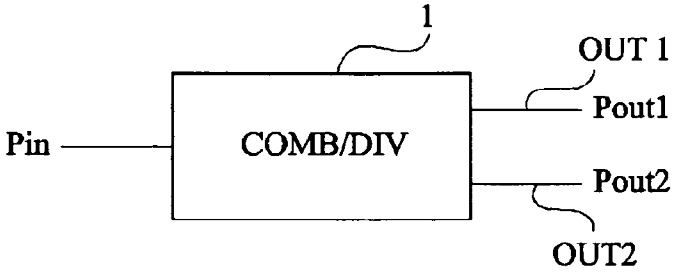
FIG. 1, previously described, shows in the form of a block a combiner/splitter of the type to which the present invention applies.
Figure 2:
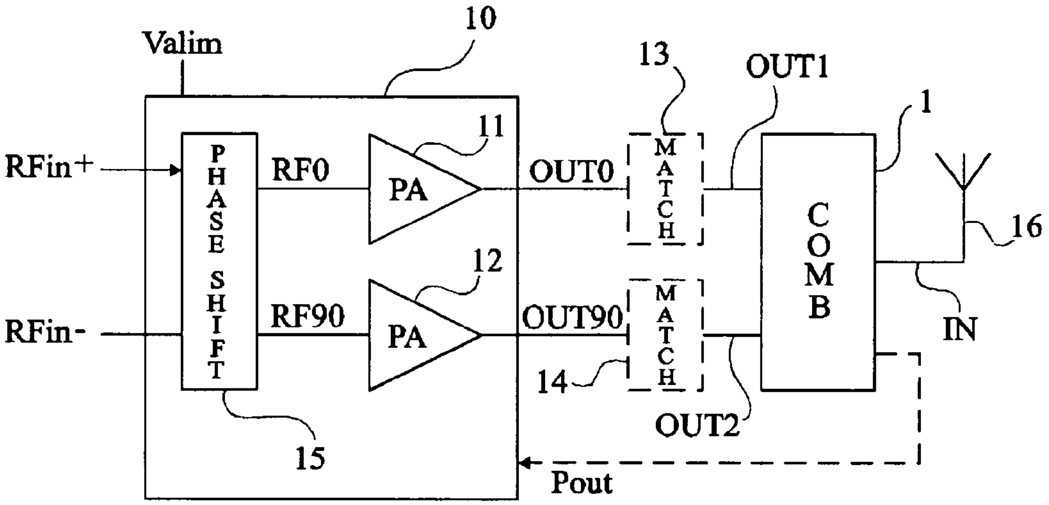
FIG. 2 very schematically shows in the form of blocks an example of an electronic circuit using a combiner of the type to which the present invention applies.
Figure 3:
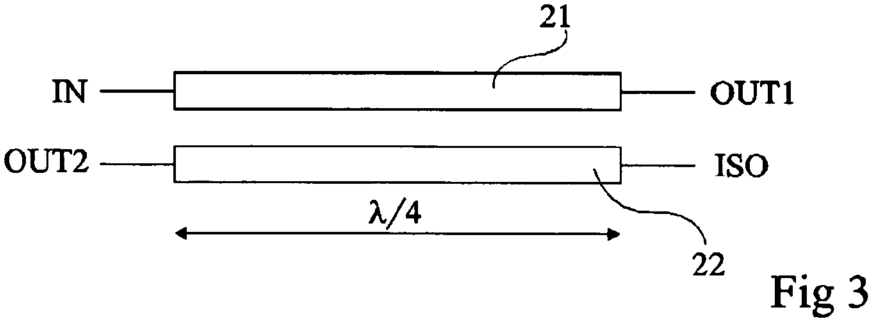
FIG. 3 shows a conventional example of a combiner/splitter with coupled lines.

For clarity, the same elements have been designated with the same reference numerals in the different drawings and, further, as usual in the representation of integrated circuits, the various drawings are not to scale.

Further, only those elements useful to the understanding of the present invention have been shown and will be described hereafter. In particular, the applications of a combiner/splitter of the present invention have not all been described in detail, since such a combiner/splitter can be used to replace a conventional device in any application implying a 90° phase-shift. Similarly, the methods for forming thin layers by using integrated circuit manufacturing technologies have not been detailed, the present invention being compatible with conventional techniques.

A feature of the present invention is to form the coupled lines of the combiner/splitter in the form of planar conductive windings in two levels stacked on each other, each level comprising two interdigited windings. Another feature of the present invention is to connect the respective ends of the coupled lines by means of capacitive elements.

Figure 4:
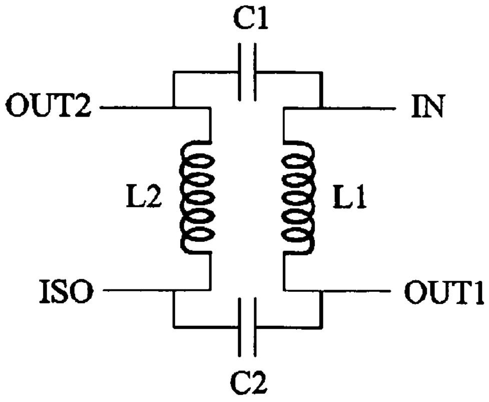
FIG. 4 shows the equivalent electric diagram of a combiner/splitter according to an embodiment of the present invention.

FIG. 4 shows the equivalent electric diagram of a combiner/splitter according to the present invention.

As previously, a first line defines a first inductive element L1 while a second line defines a second inductive element L2, coupled to the first one. The ends of the first inductive element respectively define combined access IN and one, OUT1, of the distributed accesses. The ends of inductive element L2 respectively define second distributed access OUT2 phase-shifted by 90° with respect to the signals of accesses IN and OUT1, and a terminal ISO generally charged by a 50-ohm impedance or other according to the application. The ends defining accesses IN and OUT2 are connected by a first capacitive element C1 while the ends defining accesses OUT1 and ISO are connected by a second capacitive element C2.

The function of capacitive elements C1 and C2 is to increase the coupling between lines without modifying their impedance. Another effect of the capacitive elements provided on both sides is to make the structure symmetrical.

Figure 5A:
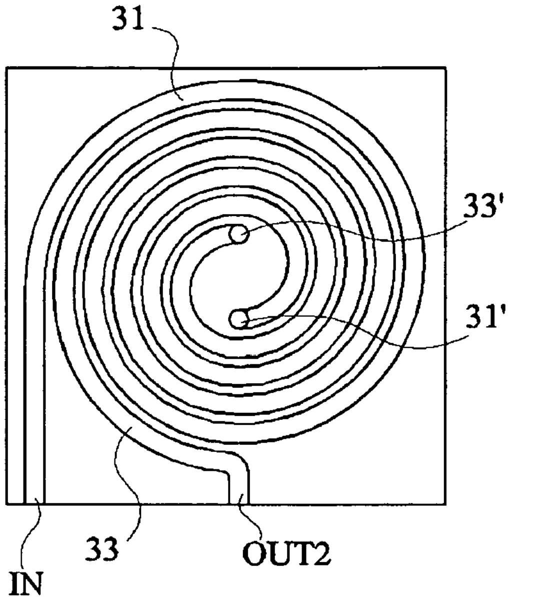
FIGS. 5A and 5B are top views of conductive levels taking part in an integrated forming of the coupled lines of the combiner/splitter of FIG. 4.
Figure 5B:
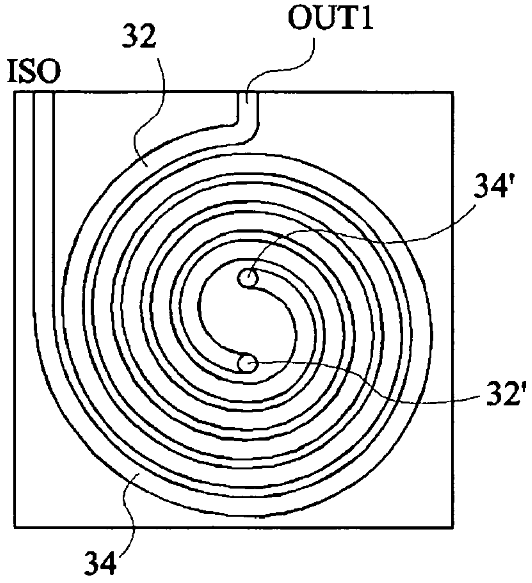
Figure 6:
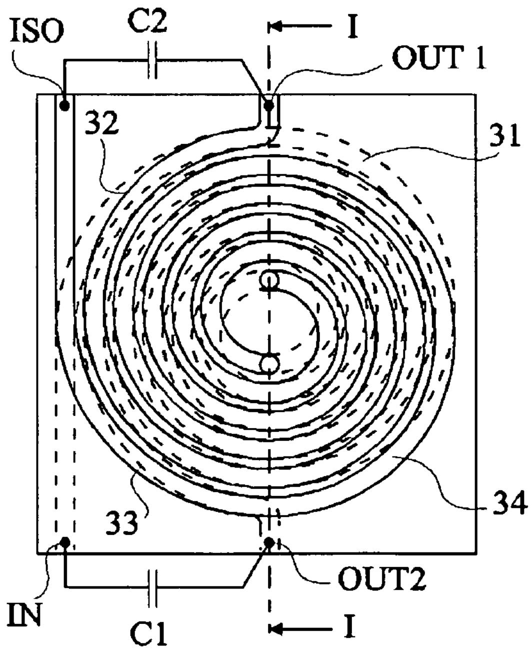
FIG. 6 is a top view of the coupled lines of the combiner/splitter according to an embodiment of the present invention.
Figure 7:
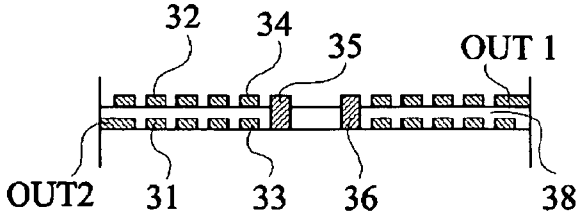
FIG. 7 is a cross-section view along line I-I of FIG. 6.

FIGS. 5A, 5B, 6, and 7 illustrate an embodiment of inductive elements L1 and L2 in the form of planar conductive windings to form a combiner/splitter according to a preferred embodiment of the present invention. FIGS. 5A and 5B are simplified top views of two conductive levels used for this embodiment. FIG. 6 is a top view illustrating the stacking of the levels of FIGS. 5A and 5B. FIG. 7 is a cross-section view along line I-I of FIG. 6.

As illustrated in FIGS. 5A and 5B, inductive element L1 is formed of two planar windings 31 and 32 formed in first (FIG. 5A) and second (FIG. 5B) conductive levels (for example, two metallization levels of an integrated circuit) which are superposed and separated by an insulator 38 (FIG. 7). Inductive element L2 is also formed of two planar windings 33 and 34, respectively in the first and second conductive levels. Winding 33 is interdigited with winding 31 while winding 34 is interdigited with winding 32. The external ends of windings 31, 32, 33, and 34 respectively define accesses IN, OUT1, OUT2, and ISO. Internal ends 31' and 32' of windings 31 and 32 are connected by a conductive via 35 (FIG. 7). Internal ends 33' and 34' of windings 33 and 34 are interconnected by a conductive via 36. The stacking order of the conductive levels is indifferent.

In the shown example, once the structure is finished (FIG. 6), windings 31 and 33 wind, in top view and from the outside, clockwise while windings 32 and 34 wind counterclockwise. The contrary is of course possible provided that the windings forming a same line wind in opposite directions (from the outside) so that the current of a same line turns in the same direction along the entire line.

The fact of stacking and interdigiting the different windings enables a coupling effect of the first winding on itself due to the second winding formed in the lower or upper level and a second coupling effect by the fact that the winding is interdigited with a winding of the other line. This increase in the coupling coefficient with respect to conventional techniques enables, among others, for the developed lengths of the lines forming the windings to be shorter than one quarter of the wavelength of the operating frequency of the coupler.

According to a preferred embodiment of the present invention, the capacitive elements (C1 and C2, FIG. 4) are made in the form of local non-distributed elements.

Such capacitive elements enable improving the coupling between spirals and accordingly the performances of the splitter/combiner.

In the preferred embodiment illustrated in FIGS. 4 to 7, the number of turns in each conductive level differs by one quarter of a turn. This enables bringing the external ends of the windings defining the accesses of the combiner/splitter close to one another. It is then possible to connect the capacitive elements (C1, C2, FIG. 6) to these ends without lengthening the coupled lines. An advantage is that this enables not having long connections to connect the capacitances and thus decreases the risk of degradation of the combiner performances.

The bandwidth of the combiner/splitter depends on the number of turns of the windings (and thus on the inductance value) as well as on the value of the associated capacitive elements.

For a given work frequency (central frequency of the bandwidth of the combiner/splitter), the shorter the windings, the higher the values of the associated capacitive elements. In high-frequency applications (greater than 100 MHz) aimed at by the present invention, the capacitive elements will have values ranging between 0.1 and 10 picofarads.

As a specific example of embodiment, to form a combiner/splitter at a 2-gigahertz work frequency with windings of 2.25 turns each, each of the capacitive elements has a 1-picofarad capacitance. The same combiner/splitter may be formed with windings of 2.75 turns and capacitive elements of 0.25 picofarads.

According to another specific example of embodiment applied to a 1-gigahertz work frequency, a combiner/splitter such as described in relation with the preceding drawings may exhibit the following features:

developed length of windings 31 to 34: 5000 μm;

width of lines 31 to 34: 30 μm;

interval between the lines of the two windings interdigited on a same plane: 10 μm; and thickness of lines 31 to 34: 9 μm.

An advantage of the present invention is that the length of the coupled lines needs not be equal to one quarter of the wavelength of the work frequency.

Another advantage of the present invention is that stacking up the windings further decreases the combiner bulk.

Another advantage of the present invention is that the structure thus obtained is directive (no signal on terminal ISO).

Another advantage of the present invention is that the phase and amplitude balance is ensured.

Of course, the present invention is likely to have various alterations, improvements, and modifications which will readily occur to those skilled in the art. In particular, the dimensions to be given to the coupled lines (lengths and sections) depend on the application and are within the abilities of those skilled in the art especially according to the desired line resistances and to the work frequency of the combiner/splitter.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A combiner/splitter with distributed lines comprising:

a first line formed of a first planar winding in a first conductive level and of a second planar winding in a second conductive level;

a second line formed of a third planar winding interdigited with the first winding in the first level, and of a fourth planar winding interdigited with the second winding in the second level;

a first discrete capacitive element connecting the external ends of the first and third windings; and a second discrete capacitive element connecting the external ends of the second and fourth windings.

2. The combiner/splitter of claim 1, wherein the windings forming a same line wind in inverse directions.

3. The combiner/splitter of claim 1, wherein:

the first and third windings have a length difference of one quarter of a turn; and the second and fourth windings have a length difference of one quarter of a turn.

4. The combiner/splitter of claim 1, wherein the capacitive elements have values selected from a range from 0.1 to 10 picofarads.

5. A method for manufacturing a combiner/splitter with two coupled lines, comprising forming a first line of a first planar winding in a first conductive level and of a second planar winding in a second conductive level;

forming a second line of a third planar winding interdigitated with the first winding in the first level and of a fourth planar winding interdigited with the second winding in the second level;

connecting a first capacitive element to connect external ends of the first and third windings; and connecting a second capacitive element to connect external ends of the second and fourth windings.

6. The method of claim 5, wherein central ends of the windings of a same line are connected by a conductive via.

7. An electrical power combiner/splitter with distributed lines, comprising:

a first line including a first planar winding in a first conductive level and a second planar winding in a second conductive level;

a second line including a third planar winding interdigitated with the first planar winding in the first conductive level and a fourth planar winding interdigitated with the second planar winding in the second conductive level;

a first capacitive element connecting external ends of the first and third planar windings; and a second capacitive element connecting external ends of the second and fourth planar windings.

8. The power combiner/splitter of claim 7, wherein the first and second planar windings wind in opposite directions and wherein the third and fourth planar windings wind in opposite directions.

9. The power combiner/splitter of claim 7, wherein the first and third planar windings have a length difference of one quarter turn and wherein the second and fourth planar windings have a length difference of one quarter turn.

10. The power combiner/splitter of claim 9, wherein central ends of the first and second planar windings are connected by a first conductive via and wherein central ends of the third and fourth planar windings are connected by a second conductive via.

* * * * *

UNITED STATES PATENT AND TRADEMARK OFFICE

CERTIFICATE OF CORRECTION

PATENT NO. : 7,667,556 B2
APPLICATION NO. : 11/605880
DATED : February 23, 2010
INVENTOR(S) : Hilal Ezzeddine It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 480 days.

Signed and Sealed this

Seventh Day of December, 2010

David J. Kappos

*Director of the United States Patent and Trademark Office*